(12) United States Patent
Huangfu et al.

(10) Patent No.: US 11,387,297 B2
(45) Date of Patent: Jul. 12, 2022

(54) ORGANIC LIGHT-EMITTING DIODE DISPLAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Lujiang Huangfu, Beijing (CN); Xing Fan, Beijing (CN); Dan Wang, Beijing (CN); Xiaowei Xu, Beijing (CN); Liangjian Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 732 days.

(21) Appl. No.: 16/092,895

(22) PCT Filed: Jan. 10, 2018

(86) PCT No.: PCT/CN2018/072084
§ 371 (c)(1),
(2) Date: Oct. 11, 2018

(87) PCT Pub. No.: WO2019/000904
PCT Pub. Date: Jan. 3, 2019

(65) Prior Publication Data
US 2021/0217830 A1    Jul. 15, 2021

(30) Foreign Application Priority Data
Jun. 30, 2017    (CN) .......................... 201710524515.5

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5271* (2013.01); *H01L 51/56* (2013.01); *H01L 2227/323* (2013.01)

(58) Field of Classification Search
CPC . H01L 27/3246; H01L 51/5271; H01L 51/56; H01L 2227/323
(Continued)

(56) References Cited

U.S. PATENT DOCUMENTS 6,515,428 B1 * 2/2003 Yeh ........................ H01L 27/322
313/489
6,777,871 B2    8/2004 Duggal et al.
(Continued)

FOREIGN PATENT DOCUMENTS

CN    1510974 A    7/2004
CN    101026180 A    8/2007
(Continued)

OTHER PUBLICATIONS

Hong et al., Review Paper: Recent Developments in Light Extraction Technologies of Organic Light Emitting Diodes, Electronic Materals Letters, Published Jun. 29, 2011, vol. 7, No. 2, pp. 77-91, Korea, 15 pages.
(Continued)

*Primary Examiner* — Dzung Tran
(74) *Attorney, Agent, or Firm* — Brooks Kushman P.C.

(57) ABSTRACT

An OLED display substrate, a manufacturing method thereof and a display device are provided. The OLED display substrate includes a TFT array layer, a first electrode, a pixel definition layer, an OEL layer and a second electrode arranged on a base substrate. The pixel definition layer is configured to define a plurality of subpixel regions. A reflection structure surrounds each subpixel region and is capable of reflecting light beams from the OEL layer and
(Continued)

beyond an escaping cone in such a manner as to enable at least parts of the light beams to enter the escaping cone.

14 Claims, 7 Drawing Sheets

(58) Field of Classification Search
USPC .......................................................... 257/40
See application file for complete search history.

(56) References Cited

U.S. PATENT DOCUMENTS

| | | |
|---|---|---|
| 6,965,197 B2 | 11/2005 | Tyan et al. |
| 6,984,934 B2 | 1/2006 | Moller et al. |
| 7,733,011 B2 | 6/2010 | Cina et al. |
| 8,179,034 B2 | 5/2012 | Potts et al. |
| 8,987,767 B2 | 3/2015 | Lee et al. |
| 2002/0047514 A1* | 4/2002 | Sakurai ............... H01L 51/5271 313/503 |
| 2002/0089497 A1* | 7/2002 | Yudasaka ............ H01L 51/5253 345/204 |
| 2002/0101155 A1* | 8/2002 | Kimura ............... H01L 51/5281 313/506 |
| 2004/0119398 A1 | 6/2004 | Koo et al. |
| 2006/0125381 A1 | 6/2006 | Oh |
| 2007/0194696 A1 | 8/2007 | Hsu et al. |
| 2008/0169461 A1 | 7/2008 | Park |
| 2008/0220683 A1* | 9/2008 | Koo .................... H01L 51/5271 445/24 |
| 2008/0238310 A1 | 10/2008 | Forrest et al. |
| 2012/0097927 A1* | 4/2012 | Shin .................... H01L 27/3246 257/40 |
| 2013/0140597 A1 | 6/2013 | Kim et al. |
| 2014/0183483 A1 | 7/2014 | Kim et al. |
| 2015/0236080 A1* | 8/2015 | Cho .................... H01L 51/5281 257/40 |
| 2016/0087244 A1* | 3/2016 | Kim .................... H01L 27/3246 257/40 |
| 2016/0359142 A1 | 12/2016 | Huangfu et al. |
| 2016/0372702 A1 | 12/2016 | Xu et al. |
| 2017/0125738 A1 | 5/2017 | Kim et al. |

FOREIGN PATENT DOCUMENTS

| | | |
|---|---|---|
| CN | 101647134 A | 2/2010 |
| CN | 103151466 A | 6/2013 |
| CN | 103915479 A | 7/2014 |
| CN | 104241541 A | 12/2014 |
| CN | 104733501 A | 6/2015 |
| CN | 204391161 U | 6/2015 |
| CN | 105206758 A | 12/2015 |
| CN | 107170904 A | 9/2017 |
| JP | H031355 A | 1/1991 |
| JP | 2003031355 A | 1/2003 |
| JP | 2004207218 A | 7/2004 |
| JP | 2007096242 A | 4/2007 |

OTHER PUBLICATIONS

First Office Action for Chinese Application No. 201710524515.5, dated Jun. 5, 2018, 7 Pages.
International Search Report and Written Opinion for Application No. PCT/CN2018/072084, dated Apr. 17, 2018, 11 Pages.
First Office Action for Japanese Application No. 2019-544619, dated Mar. 15, 2021, 5 Pages.
Extended European Search Report for European Application No. 18823282.1, dated Feb. 26, 2021, 8 Pages.
1$^{st}$ Japanese Office Action, English Translation.
JP2003031355A, English Abstract and Machine Translation.
JP2004207218A, English Abstract and U.S. Equivalent U.S. Pub. No. 2004/011938.
First Office Action for Indian Application No. 201947034796, dated May 3, 2021, 6 Pages (including English translation).

* cited by examiner

--Prior Art--

ORGANIC LIGHT-EMITTING DIODE DISPLAY SUBSTRATE, MANUFACTURING METHOD THEREOF AND DISPLAY DEVICE

CROSS-REFERENCE TO RELATED APPLICATIONS

This application is the U.S. national phase of PCT Application No. PCT/CN2018/072084 filed on Jan. 10, 2018, which claims priority to Chinese Patent Application No. 201710524515.5 filed on Jun. 30, 2017, which are incorporated herein by reference in their entireties.

TECHNICAL FIELD

The present disclosure relates to the field of display technology, in particular to an organic light-emitting diode (OLED) display substrate, a manufacturing method thereof and a display device.

BACKGROUND

Layers of an OLED device include film layers such as an organic electroluminescence (OEL) layer, a transparent electrode and a substrate, and each of the film layers has a refractive index greater than air. Due to the existence of total reflection, merely parts of light beams from the OEL layer each having an incident angle at each interface in a given light-emitting direction that is smaller than a total reflection angle may exit from the OLED device directly. The light beams generated by a certain light-emitting point (or a secondary light source point) and passing through the interfaces of the film layers form a cone, i.e., an escaping cone. For the OLED device in a bottom-emission (BE) mode, the light beams within the escaping cone may exit from the OLED device directly. The light beams beyond the escaping cone may be totally reflected at different interfaces and then transmitted in the corresponding film layers in a wave guide mode. Usually, a proportion of the number of light beams transmitted in the wave guide mode to the total number of light beams is greater than the number of light beams capable of directly exiting from the OLED device to the total number of light beams. Hence, a luminous efficiency of the OLED device may be significantly adversely affected.

SUMMARY

An object of the present disclosure is to provide an OLED display substrate, a manufacturing method thereof, and a display device, so as to improve the luminous efficiency of the OLED display device.

In one aspect, the present disclosure provides in some embodiments an OLED display substrate, including a thin film transistor (TFT) array layer, a first electrode, a pixel definition layer, an OEL layer and a second electrode that are arranged on a base substrate. The pixel definition layer is configured to define a plurality of subpixel regions. A reflection structure is arranged to surround each of the subpixel regions, and is capable of reflecting light beams that are transmitted from the OEL layer and beyond an escaping cone, to enable at least parts of the reflected light beams to enter the escaping cone.

In a possible embodiment of the present disclosure, a groove surrounds each subpixel region, and the reflection structure is a reflection layer formed at a side wall of the groove.

In a possible embodiment of the present disclosure, the groove is formed in the pixel definition layer, and a depth of the groove is not greater than a thickness of the pixel definition layer.

In a possible embodiment of the present disclosure, the TFT array layer and the pixel definition layer surround each of the subpixel regions, the pixel definition layer is arranged on the TFT array layer, the groove is formed on a laminated structure consisting of the TFT array layer and the pixel definition layer surrounding each of the subpixel regions, and a depth of the groove is greater than a thickness of the pixel definition layer and not greater than a sum of the thickness of the pixel definition layer and a thickness of the TFT array layer.

In a possible embodiment of the present disclosure, the TFT array layer and the pixel definition layer surround each of the subpixel regions, the pixel definition layer is arranged on the TFT array layer, the groove is formed on a laminated structure consisting of the base substrate, the TFT array layer and the pixel definition layer surrounding each of the subpixel regions, and a depth of the groove is greater than a sum of a thickness of the TFT array layer and a thickness of the pixel definition layer, and smaller than a sum of the thickness of the pixel definition layer, the thickness of the TFT array layer and a thickness of the base substrate.

In a possible embodiment of the present disclosure, the first electrode is a transparent electrode, the second electrode is a reflective metal electrode, and the reflection layer is made of a same material as the second electrode.

In a possible embodiment of the present disclosure, the TFT array layer is provided with an opening surrounding each of subpixel regions, and a portion of the pixel definition layer is arranged in the opening.

In a possible embodiment of the present disclosure, the reflection layer comprises a first portion and a second portion, the first portion is angled relative to the TFT array layer at a first angle, the second portion is angled relative to the pixel definition layer at a second angle, and the first angle is different from the second angle.

In a possible embodiment of the present disclosure, the reflection layer is of a V-shaped or trapezoidal cross section, and the V-shaped or trapezoidal cross section is perpendicular to an extension direction of the reflection layer.

In another aspect, the present disclosure provides in some embodiments a display device including the above-mentioned display substrate.

In yet another aspect, the present disclosure provides in some embodiments a method for manufacturing an OLED display substrate, including: forming a TFT array layer, a first electrode, a pixel definition layer, an OEL layer and a second electrode sequentially on a base substrate, wherein the pixel definition layer is configured to define a plurality of subpixel regions; and forming a reflection structure surrounding each of the subpixel regions, wherein the reflection structure is capable of reflecting light beams that are transmitted from the OEL layer and beyond an escaping cone, to enable at least parts of the reflected light beams to enter the escaping cone.

In a possible embodiment of the present disclosure, the forming the TFT array layer includes: forming the TFT array layer that has an opening and surrounds each of the subpixel regions In a possible embodiment of the present disclosure, the forming the reflection structure includes: forming a groove surrounding each of the subpixel regions, and forming a reflection layer on a side wall of the groove.

In a possible embodiment of the present disclosure, the forming the reflection layer includes: forming the second electrode and the reflection layer through a single process.

In a possible embodiment of the present disclosure, the forming the reflection layer includes: forming a first portion of the reflection layer and a second portion of the reflection layer, wherein the first portion is angled relative to the TFT array layer at a first angle, the second portion is angled relative to the pixel definition layer at a second angle, and the first angle is different from the second angle.

Figure 1:
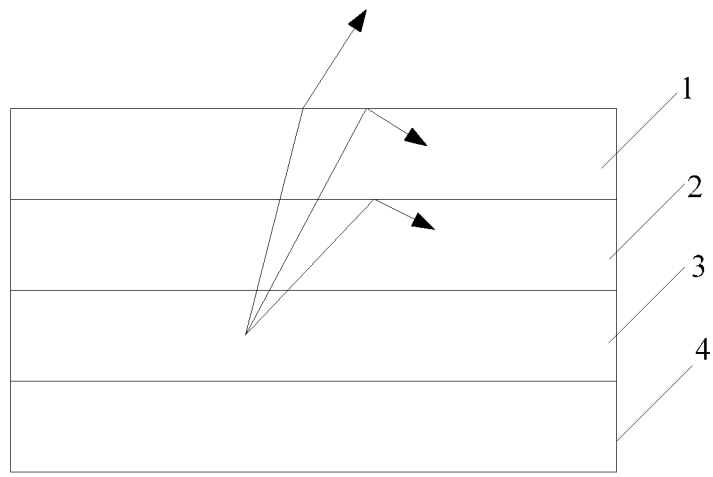
FIG. 1 is a schematic view showing a light loss occurring for a bottom-emission OLED display element.

REFERENCE SIGNS LIST 1 base substrate
2 transparent electrode
3 OEL layer
4 reflective metal electrode
5 TFT array layer
6 pixel definition layer
7 reflection layer
A, A1, A2, A3 escaping cone

DETAILED DESCRIPTION

In order to make the objects, the technical solutions and the advantages of the present disclosure more apparent, the present disclosure will be described hereinafter in conjunction with the drawings and embodiments.

Figure 2:
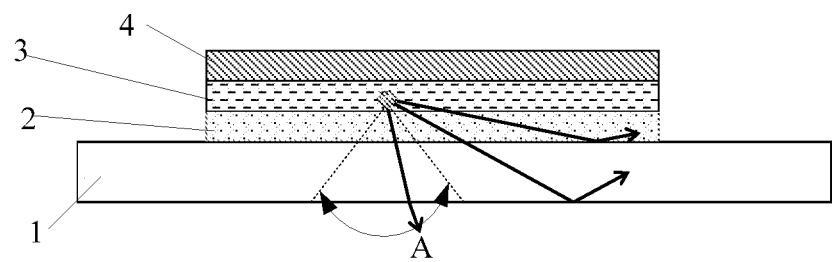
FIG. 2 is a schematic view showing the propagation of light beams inside the bottom-emission OLED display element.

A bottom-emission OLED display element has a relatively complex layer structure. At first, a pixel definition layer (PDL) is arranged surrounding each pixel so as to define a pixel light-emitting region, and no current flows through a region corresponding to the PDL, so the PDL does not emit light. Usually, the PDL is made of a material having a refractive index substantially similar to a light-emitting material of an OLED, so a light beam generated by an OEL layer may pass through an organic light-emitting layer and a transparent electrode layer into the PDL. Next, an OLED pixel structure includes a TFT array layer, and the light beam generated by the OEL layer may enter the TFT array layer. During the transmission of the light beams in the PDL and the TFT array layer, a light loss may occur, i.e., parts of the light beams may not be valid for the display. As shown in FIGS. 1 and 2, the light beams generated by the OEL layer 3 may also be reflected at an interface between a base substrate 1 and air, and at an interface between a transparent electrode 2 and the base substrate 1, so an amount of the valid light beams may be further reduced.

Figure 3:
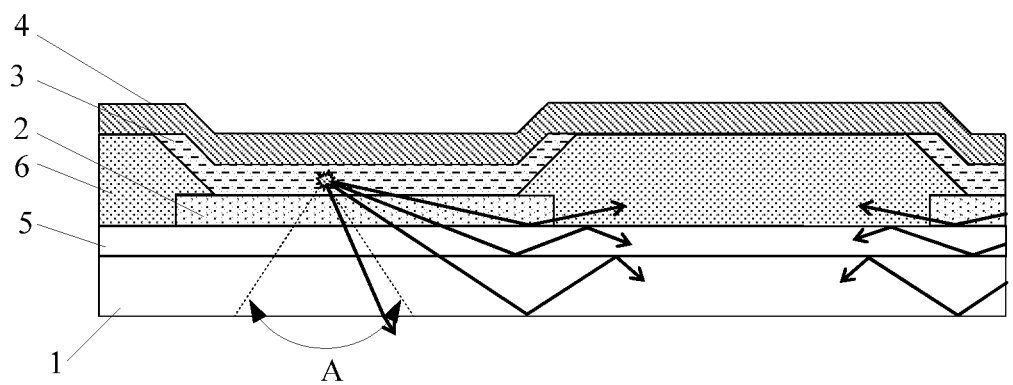
FIG. 3 is a schematic view showing the propagation and the loss of the light beams inside the bottom-emission OLED display element.

As shown in FIGS. 2 and 3, for the bottom-emission OLED display element, merely the light beams generated by the OEL layer 3 each having an incident angle in a given light-exiting direction at each interface smaller than a total reflection angle (i.e., the light beams within an escaping cone A) may directly exit from a given light-exiting surface of the OLED display element. Due to the total reflection, the light beams beyond the escaping cone A may be transmitted in the layers in a wave guide mode and finally lost in the OEL layer/transparent electrode, the TFT array layer, and the base substrate. Due to the transmission of the light beams in the wave guide mode, a luminous efficiency of the OLED display element may be reduced.

An object of the present disclosure is to provide an OLED display substrate, a manufacturing method thereof and a display device, so as to improve the luminous efficiency of the OLED display device.

According to the embodiments of the present disclosure, a reflection structure is arranged in such layers as a PDL surrounding an OEL layer for each pixel and a TFT array layer, so as to reflect light beams transmitted therein in a wave guide mode. Through selecting a gradient angle of a reflection surface, it is able to reflect the light beams in a given direction, thereby to enable parts of the light beams to exit the wave guide mode and enter an escaping cone and become valid light beams for the display. As a result, it is able to obviously improve the luminous efficiency of the bottom-emission OLED display element.

The present disclosure provides in some embodiments an OLED display substrate, which includes a TFT array layer, a first electrode, a pixel definition layer, an OEL layer and a second electrode arranged on a base substrate. The pixel definition layer is configured to define a plurality of subpixel regions. A reflection structure surrounds each subpixel region and is capable of reflecting light beams from the OEL layer and beyond an escaping cone in such a manner as to enable at least parts of the light beams to enter the escaping cone.

According to the OLED display substrate in the embodiments of the present disclosure, the reflection structure surrounds each subpixel region and it is capable of reflecting the light beams from the OEL layer and beyond the escaping cone in such a manner as to enable at least parts of the light beams to enter the escaping cone, i.e., to enable the light beams transmitted in a wave guide mode to exit the wave guide mode and become valid light beams for the display. As a result, it is able to obviously improve the luminous efficiency of a bottom-emission OLED display device.

To be specific, a groove surrounds each subpixel region, and the reflection structure is a reflection layer formed at a side wall of the groove.

In a possible embodiment of the present disclosure, the groove is formed in the pixel definition layer, and has a depth not greater than a thickness of the pixel definition layer.

In another possible embodiment of the present disclosure, the TFT array layer and the pixel definition layer on the TFT array layer surround each subpixel region, the groove is formed on a laminated structure consisting of the TFT array layer and the pixel definition layer surrounding each subpixel region, and the groove has a depth greater than a thickness of the pixel definition layer and not greater than a sum of the thickness of the pixel definition layer and a thickness of the TFT array layer.

In yet another possible embodiment of the present disclosure, the TFT array layer and the pixel definition layer on the TFT array layer surround each subpixel region, the groove is formed on a laminated structure consisting of the base substrate, the TFT array layer and the pixel definition layer surrounding each subpixel region, and the groove has a depth greater than a sum of a thickness of the TFT array layer and a thickness of the pixel definition layer and smaller than a sum of the thickness of the pixel definition layer, the thickness of the TFT array layer and a thickness of the base substrate.

In a possible embodiment of the present disclosure, the first electrode is a transparent electrode, the second electrode is a reflective metal electrode, and the reflection layer is made of a same material as the second electrode. In this way, the reflection layer and the second electrode may be formed through a single photoetching process, so as to reduce the number of photoetching processes during the manufacture of the display substrate.

In a possible embodiment of the present disclosure, the TFT array layer is provided with an opening surrounding each subpixel region, and a portion of the pixel definition layer is arranged in the opening.

In a possible embodiment of the present disclosure, the reflection layer includes a first portion angled relative to the TFT array layer at a first angle and a second portion angled relative to the pixel definition layer at a second angle different from the first angle.

In a possible embodiment of the present disclosure, the reflection layer is of a V-shaped or trapezoidal cross section perpendicular to its extension direction.

The present disclosure further provides in some embodiments a display device including the above-mentioned display substrate. The display device may be any product or member having a display function, e.g., television, display, digital photo frame, mobile phone or flat-panel computer. The display device may further include a flexible circuit board, a printed circuit board and a back plate.

The present disclosure further provides in some embodiments a method for manufacturing an OLED display substrate, including: forming a TFT array layer, a first electrode, a pixel definition layer, an OEL layer and a second electrode sequentially on a base substrate, the pixel definition layer defining a plurality of subpixel regions; and forming a reflection structure surrounding each subpixel region and capable of reflecting light beams from the OEL layer and beyond an escaping cone in such a manner as to enable at least parts of the light beams to enter the escaping cone.

According to the method in the embodiments of the present disclosure, the reflection structure surrounds each subpixel region, and is capable of reflecting the light beams from the OEL layer and beyond the escaping cone in such a manner as to enable at least parts of the light beams to exit the wave guide mode and enter the become valid light beams for the display. As a result, it is able to significantly improve the luminous efficiency of a bottom-emission OLED display device.

In a possible embodiment of the present disclosure, the forming the TFT array layer includes: forming the TFT array layer having an opening surrounding each subpixel region.

In a possible embodiment of the present disclosure, the forming the reflection structure includes: forming a groove surrounding each subpixel region and forming a reflection layer on a side wall of the groove.

In a possible embodiment of the present disclosure, the forming the reflection layer includes: forming the second electrode and the reflection layer through a single process, so as to reduce the number of photoetching processes during the manufacture of the display substrate.

In a possible embodiment of the present disclosure, the forming the reflection layer includes: forming a first portion of the reflection layer angled relative to the TFT array layer at a first angle and a second portion of the reflection layer angled relative to the pixel definition layer at a second angle different from the first angle.

The present disclosure will be described hereinafter in conjunction with the embodiments and drawings in more details.

Figure 4:
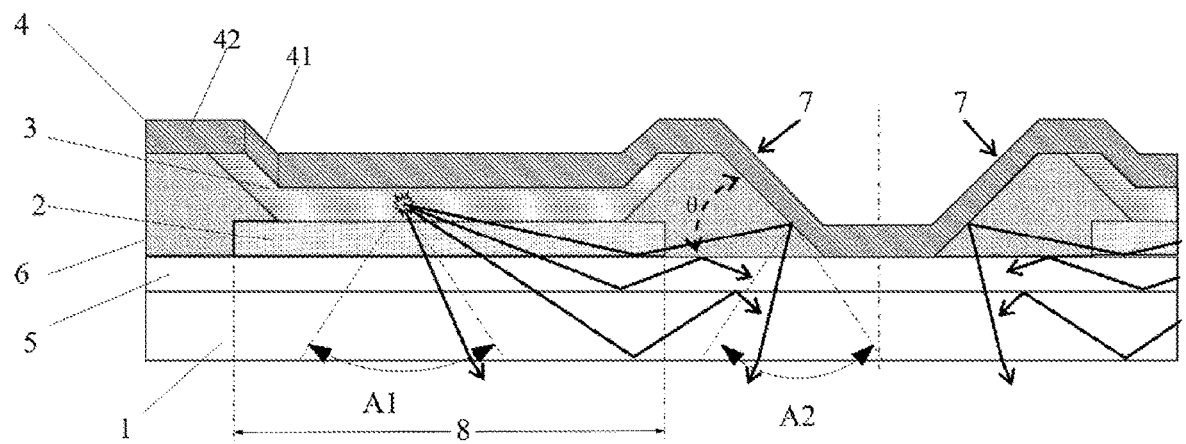
FIG. 4 is a schematic view showing an OLED display substrate and the propagation of light beams of the OLED display substrate according to some embodiments of the present disclosure.

In a possible embodiment of the present disclosure, as shown in FIG. 4, the groove may be formed in the pixel definition layer 6 surrounding each subpixel region 8, and the groove may have a depth equal to the thickness of the pixel definition layer 6. The reflection layer 7 may be formed on the side wall of the groove. A gradient angle $\theta$ of the side wall of the groove may be selected in such a manner as to reflect the light beams transmitted in the pixel definition layer in the wave guide mode as many as possible toward an escaping cone A2 and become the valid light beams for the display. Here, the depth of the groove may also be greater than or smaller than the thickness of the pixel definition layer 6, which will be described in more details hereinafter. In addition, the reflection layer 7 comprises a first portion 41 and a second portion 42, the first portion 41 is not parallel to a TFT array layer 5, and the second portion 42 is parallel to the TFT array layer 5.

When no reflection structure is provided, merely a part of the light beams generated by the OEL layer 3 within the escaping cone A1 are valid light beams for the display. After the formation of the reflection structure, a part of the light beams generated by the OEL layer 3 may pass through the transparent electrode 2 (i.e., an anode) into the pixel definition layer 6, and then may be reflected by the reflection layer 7 and enter the escaping cone A2 to become the valid light beams for the display. As a result, it is able to improve the luminous efficiency of the OLED display element.

During the manufacture of the display substrate, the pixel definition layer 6 is formed on the base substrate 1. When pixel opening regions are formed by the pixel definition layer 6 through a photoetching process, the groove may be formed by the pixel definition layer 6 surrounding each pixel opening region. Then, the OEL layer may be formed through a conventional process, and the reflection layer 7 may be formed on the side wall of the groove while forming the reflective electrode (i.e., a cathode).

Figure 5:
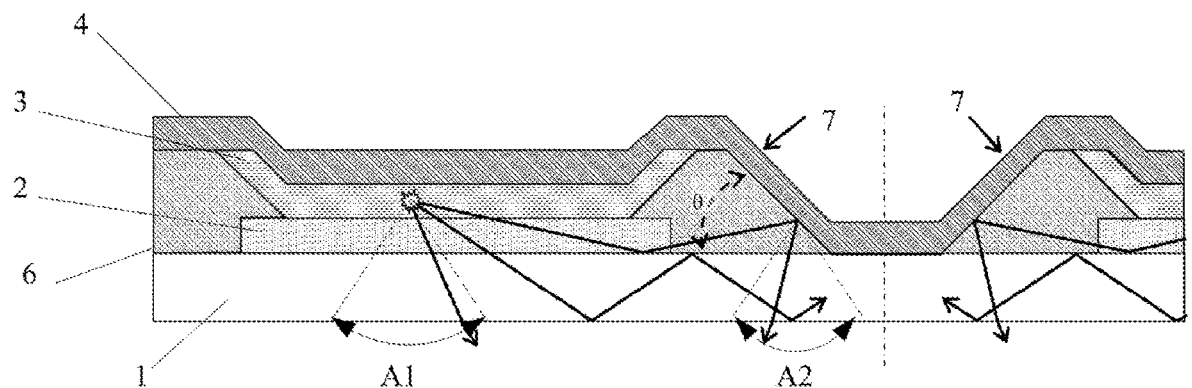
FIG. 5 is a schematic view showing another OLED display substrate and the propagation of the light beams of the OLED display substrate according to some embodiments of the present disclosure.

In a possible embodiment of the present disclosure, as shown in FIG. 5, the pixel definition layer 6 may be directly formed on the base substrate 1 between two adjacent subpixel regions, and no TFT array layer 5 may be arranged surrounding each subpixel region. The groove may be formed in the pixel definition layer 6 surrounding each subpixel region, and the groove may have a depth equal to the thickness of the pixel definition layer 6. The reflection layer 7 may be formed on the side wall of the groove, and the gradient angle θ of the side wall of the groove may be selected in such a manner as to reflect the light beams transmitted in the pixel definition layer in the wave guide mode as many as possible toward an escaping cone A2 to become the valid light beams for the display.

Here, the light beams are transmitted in the wave guide mode in the OEL layer/transparent electrode and the base substrate, rather than in the TFT array layer. When no reflection structure is formed, merely the light beams generated by the OEL layer 3 within the escaping cone A1 may become the valid light beams for the display. After the formation of the reflection structure, the light beams in the OLE layer/transparent electrode mode may pass through the OEL layer 3 and the transparent electrode 1 (i.e., the anode) into the pixel definition layer 6, and then reflected by the reflection layer 7, and a part of the reflected light beams enters the escaping cone A2 to become the valid light beams for the display. As a result, it is able to improve the luminous efficiency of the OLED display element.

Figure 6:
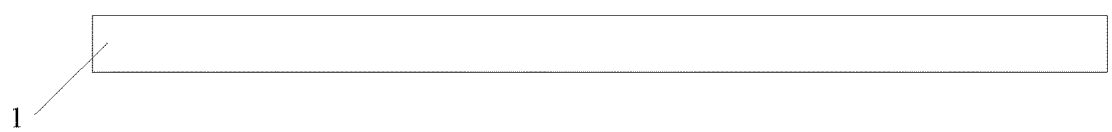
FIGS. 6 and 7 are schematic views showing the manufacture of the OLED display substrate according to some embodiments of the present disclosure.
Figure 7:
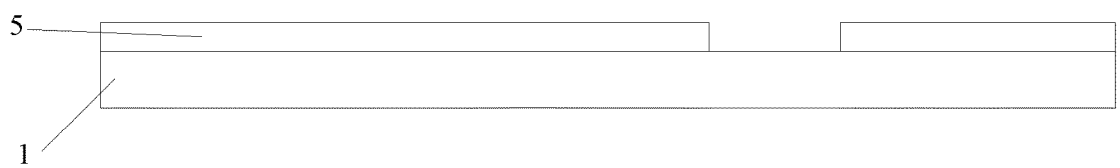

As shown in FIGS. 6 and 7, after the formation of the TFT array layer 5 on the base substrate 1, an additional photoetching process may be provided so as to remove a portion of the TFT array layer 5 surrounding each subpixel region. Alternatively, the portion of the TFT array layer 5 surrounding each subpixel region may also be removed through a last photoetching process or several last photoetching processes (usually for the formation of via-holes) of the display substrate, and then the pixel definition layer 6 and the other layers thereon may be formed through conventional processes.

Figure 8:
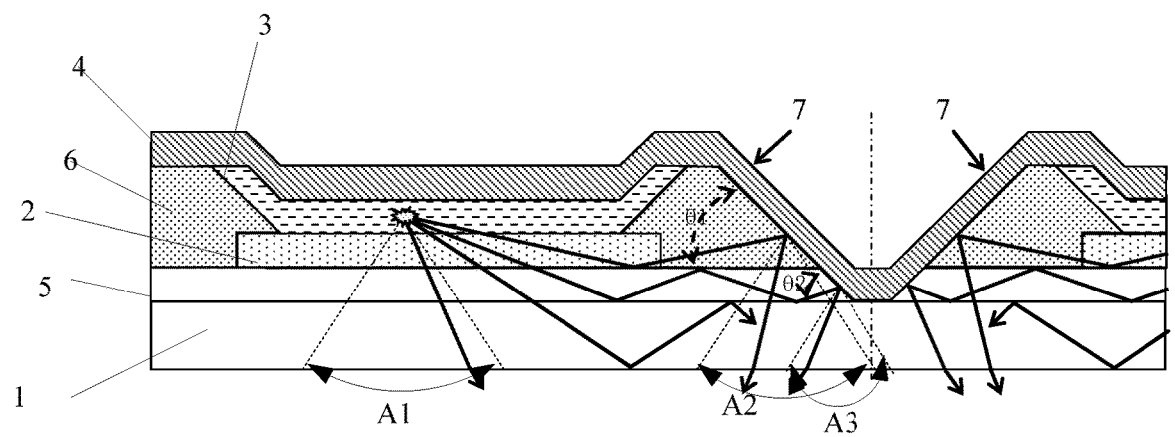
FIG. 8 is yet another schematic view showing the OLED display substrate and the propagation of the light beams of the OLED display substrate according to some embodiments of the present disclosure.

In a possible embodiment of the present disclosure, as shown in FIG. 8, the pixel definition layer 6 may be formed on the base substrate 1 surrounding each subpixel region, and the TFT array layer 5 may surround each subpixel region. The groove may be formed in a laminated structure consisting of the pixel definition layer 6 and the TFT array layer 5 surrounding each subpixel region, and the groove may have a depth equal to a sum of the thickness of the pixel definition layer 6 and the thickness of the TFT array layer 5. The reflection layer 7 may be formed on the side wall of the groove. A gradient angle $\theta_1$ of the side wall of the groove corresponding to the pixel definition layer 6 and a gradient angle $\theta_2$ of the side wall of the groove corresponding to the TFT array layer 5 may be selected in such a manner as to reflect the light beams transmitted in the pixel definition layer and the TFT array layer in the wave guide mode as many as possible toward the escaping cone A2 and an escaping cone A3 respectively to become the valid light beams for the display. To be specific, values of $\theta_1$ and $\theta_2$ may be set in accordance with the distribution of the light beams transmitted in the layers in the wave guide mode and optical characteristics of materials of the layers (mainly refractive indices). It should be appreciated that, in a planar wave guide, the light beams are reflected by an upper interface and a lower interface alternately so as to travel in a wave form, so the light beams are not transmitted toward the reflection surface horizontally, i.e., each light beam may reach the reflection surface at a certain elevation or depression angle.

Here, the values of $\theta_1$ and $\theta_2$ may be calculated through a mathematical formula in accordance with such parameters as the elevation or depression angles, wavelengths of the light beams, a thickness of the wave guide, and a return loss at a reflection surface between a wave guide medium and an adjacent medium. Usually, each of $\theta_1$ and $\theta_2$ may be smaller than or equal to 45°. For example, in the PDL layer, $\theta_1$ be in a range from 30° to 35°.

When no reflection structure is formed, merely the part of the light beams generated by the OEL layer 3 within the escaping cone A1 may be the valid light beams for the display. After the formation of the reflection structure, the light beams in the OEL layer/transparent electrode mode may pass through the OEL layer 3 and the transparent electrode 1 (i.e., the anode) into the pixel definition layer 6, and then reflected by the reflection layer 7, and a part of the reflected light beams enters the escaping cone A2 to come the valid light beams for the display. Identically, the light beams in the wave guide mode may pass through the TFT array layer 5, and be reflected by the reflection layer 7, and then a part of the reflected light beams enters the escaping cone A3 to become the valid light beams for the display. As a result, it is able to improve the luminous efficiency of the OLED display element.

Figure 9:
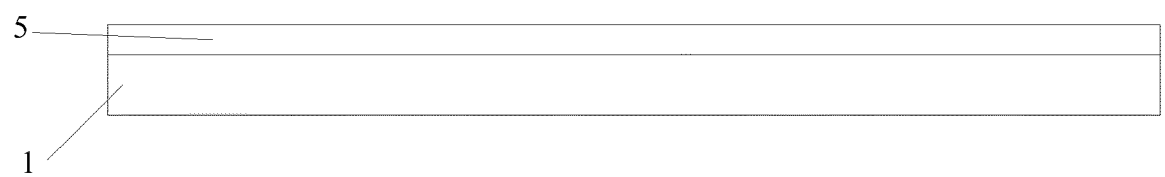
FIGS. 9-16 are schematic views showing the manufacture of the OLED display substrate according to some embodiments of the present disclosure.
Figure 10:
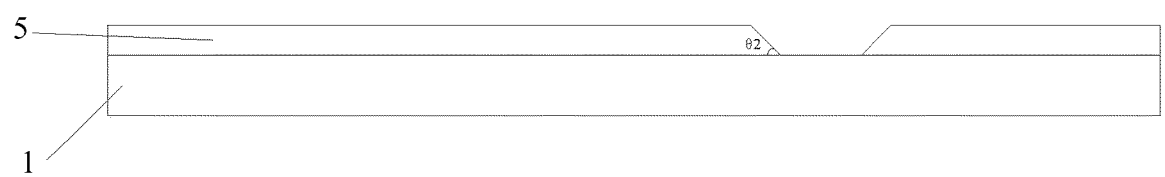
Figure 11:
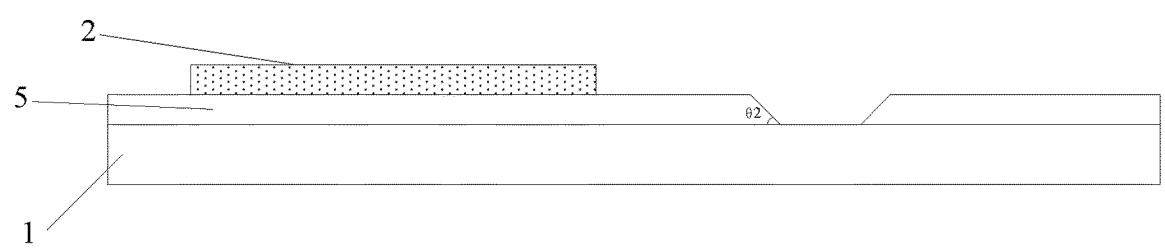
Figure 12:
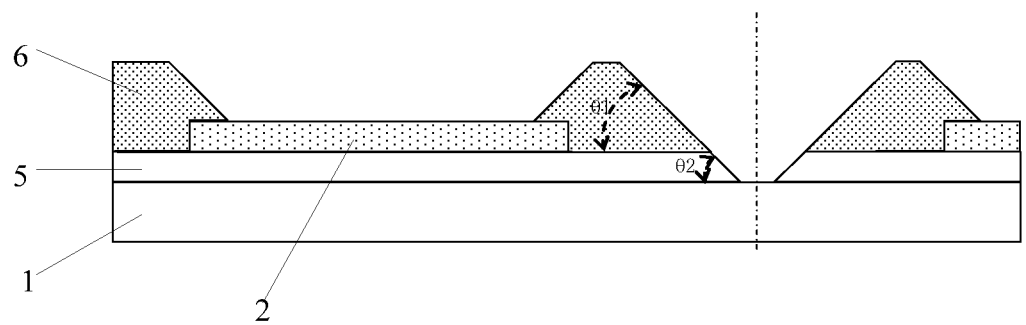

As shown in FIG. 9, during the manufacture of the display substrate, the TFT array layer 5 may be formed at first on the base substrate 1. As shown in FIG. 10, after the formation of the TFT array layer 5, an additional photoetching process may be provided so as to remove a portion of the TFT array layer 5 surrounding the pixel light-emitting region. In addition, the portion of the TFT array layer 5 at the corresponding region may also be removed through a last photoetching process or several last photoetching processes (usually for the formation of via-holes) during manufacturing of the display substrate. As shown in FIG. 11, the transparent electrode 2 may be formed. As shown in FIG. 12, finally a pattern of the pixel definition layer 6 may be formed through a photoetching process.

Figure 13:
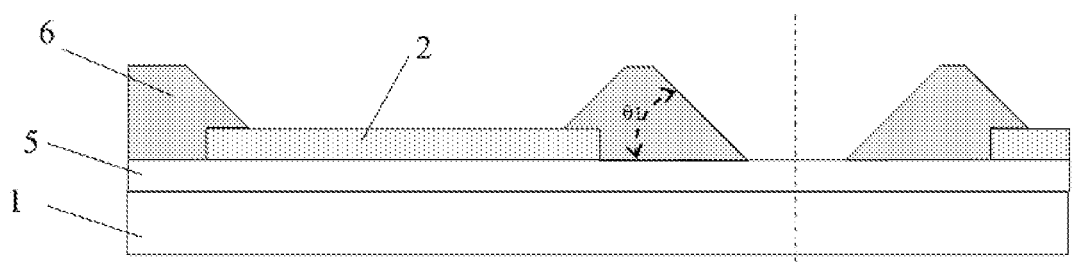
Figure 14:
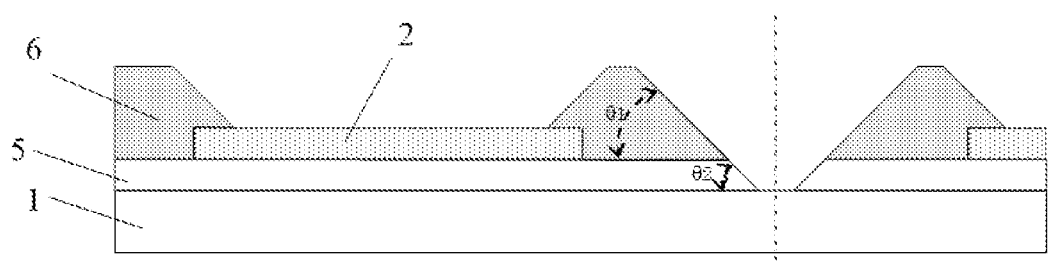

In addition, as shown in FIGS. 13 and 14, after the formation of the groove in the pixel definition layer 6, an additional etching process with the pixel definition layer 6 and the transparent electrode 2 as a mask plate may be provided so as to remove the portion of the TFT array layer 5 surrounding the pixel light-emitting region. In this way, the groove in the pixel definition layer 6 may be aligned automatically with the groove in the TFT array layer 5, so it is able to control a shape of the entire reflection interface and improve the reflection performance.

Figure 15:
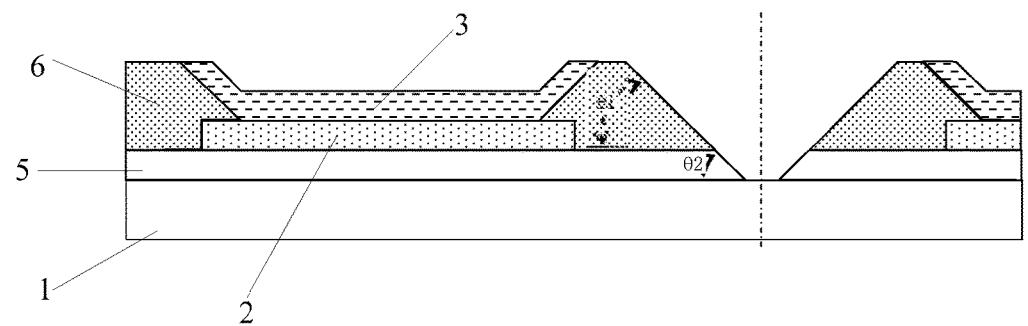
Figure 16:
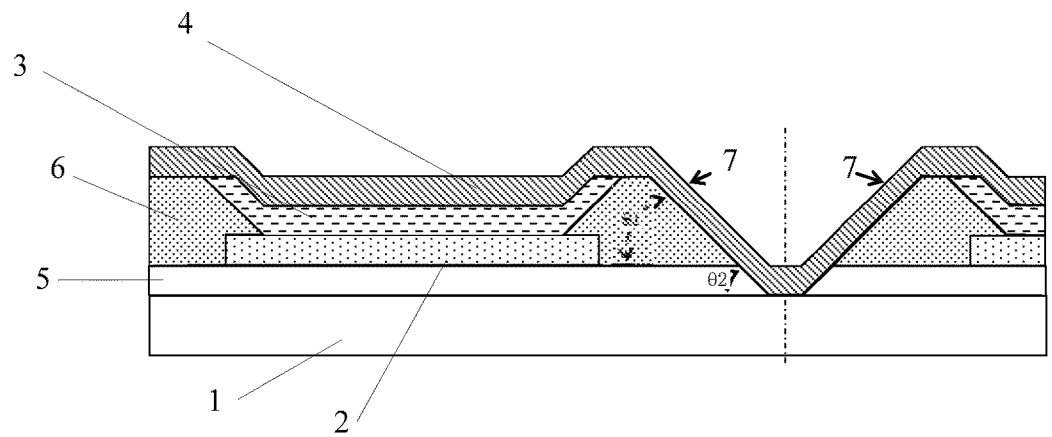

And then after that, as shown in FIG. 15, the OEL layer 3 may be formed at the pixel light-emitting region through printing or evaporation. As shown in FIG. 16, a reflective metal layer may be formed through evaporation, so as to form the reflective electrode 4 and the reflection layer 7 simultaneously. The reflective metal layer on the side wall of the groove may form the reflection layer 7.

Figure 17:
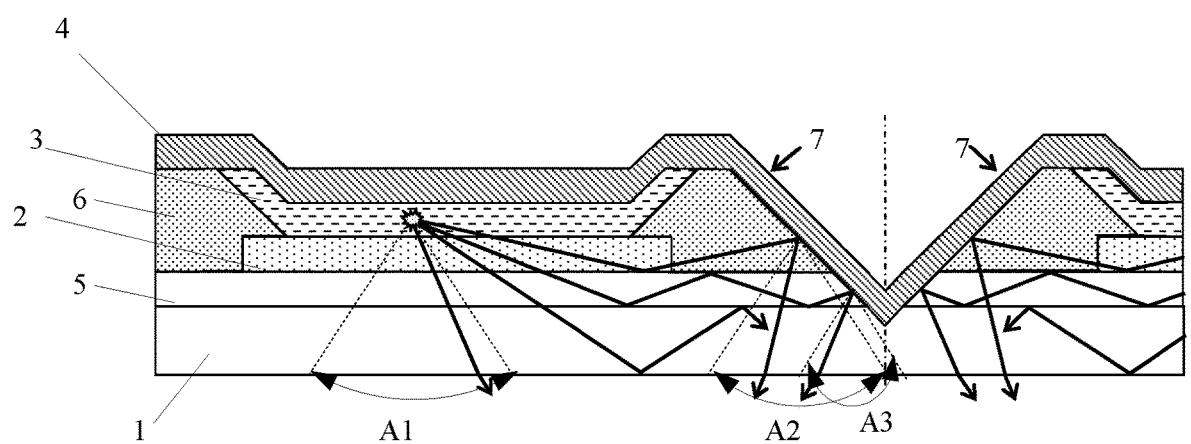
FIG. 17 is a schematic view showing still yet another OLED display substrate and the propagation of the light beams of the OLED display substrate according to some embodiments of the present disclosure.

In a possible embodiment of the present disclosure, as shown in FIG. 17, the TFT array layer 5 may be formed on the base substrate surrounding each subpixel region, and the pixel definition layer 6 may be formed on the TFT array layer 5. The groove may be formed in a laminated structure consisting of the base substrate 1, the TFT array layer 5 and the pixel definition layer 6 surrounding each subpixel region, and the groove may have a depth equal to a sum of the thickness of the pixel definition layer 6, the thickness of the TFT array layer 5 and a thickness of a part of the base substrate 1, i.e., the groove may extend into a part of the base substrate 1. The reflection layer 7 may be formed on the side wall of the groove. A gradient angle of a part of the side wall of the groove corresponding to the pixel definition layer 6, a gradient angle of a part of the side wall of the groove corresponding to the TFT array layer 5 and a gradient angle of a part of the side wall of the groove corresponding to the base substrate 1 may be selected in such a manner as to reflect the light beams transmitted in the pixel definition layer, the base substrate, and the TFT array layer in the wave guide mode as many as possible toward the escaping cones A2 and A3, to become the valid light beams for the display. To be specific, the values of these gradient angles may be set in accordance with the distribution of the light beams transmitted in the layers in the wave guide mode and the optical characteristics of the materials of the layers (mainly the refractive indices).

Considering features of the etching process, it is very difficult to ensure a gradient of a bottom of a side wall of the TFT array layer 5 relative to a surface of the base substrate 1 to be consistent with a main portion of the side wall of the groove, and a transitional arc surface may easily be formed. When the groove extends into the base substrate, it is able to ensure the consistency of the reflection layer 7 on the side wall of the entire groove, thereby to improve a reflection effect. In addition, when the reflection layer 7 extends into a part of the base substrate 1, it is able to reflect a part of the light beams transmitted in the base substrate in the wave guide mode, thereby to increase the amount of the valid light beams for the display.

Figure 18:
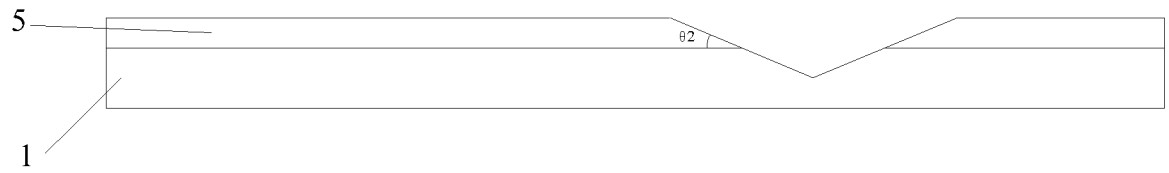
FIG. 18 is a schematic view showing the manufacture of the OLED display substrate according to some embodiments of the present disclosure.

As shown in FIG. 18, subsequent to the etching process for removing a portion of the TFT array layer 5, an additional etching process of the base substrate with the TFT array layer 5 as a mask plate may be provided, so as to enable the groove to extend into the base substrate 1.

Figure 19:
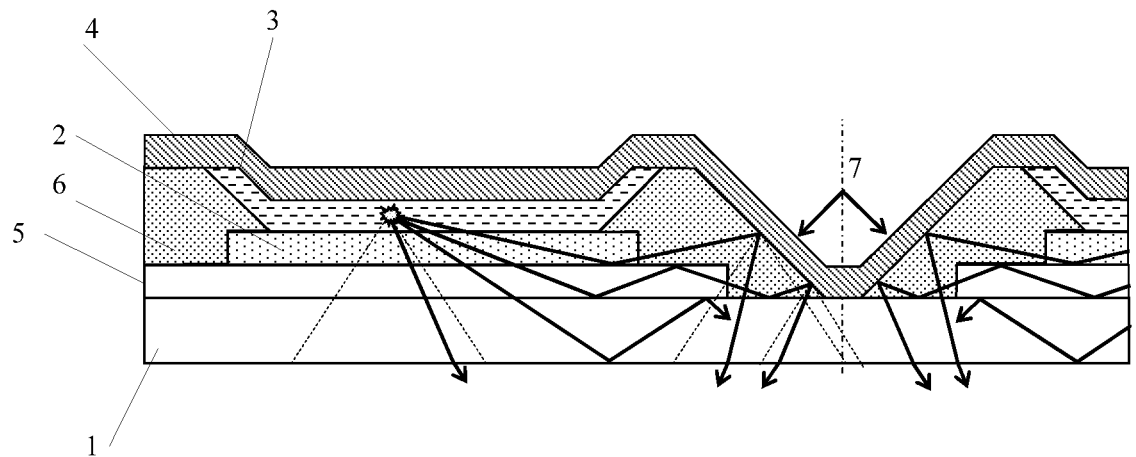
FIG. 19 is a schematic view showing still yet another OLED display substrate and the propagation of the light beams of the OLED display substrate according to some embodiments of the present disclosure.

In a possible embodiment of the present disclosure, as shown in FIG. 19, the pixel definition layer 6 may be formed on the base substrate 1 surrounding each subpixel region, and no TFT array layer 5 may be arranged surrounding each subpixel region. The groove may be formed in the pixel definition layer 6 surrounding each subpixel region, and the groove may have a depth equal to a sum of the thickness of the pixel definition layer 6 and the thickness of the TFT array layer 5. The reflection layer 7 may be formed on the side wall of the groove. The gradient angle of the side wall of the groove may be selected in such a manner as to reflect the light beams transmitted in the pixel definition layer and the TFT array layer in the wave guide mode as many as possible toward the escaping cones A2 and A3 to become the valid light beams for the display. To be specific, the values of the gradient angles may be set in accordance with the distribution of the light beams transmitted in the layers in the wave guide mode and the optical characteristics of the materials of the layers (mainly the refractive indices).

When no reflection structure is formed, merely the light beams generated by the OEL layer 3 within the escaping cone A1 may be the valid light beams for the display. After the formation of the reflection structure, the light beams in the OEL layer/transparent electrode mode may pass through the OEL layer 3 and the transparent electrode 1 (i.e., the anode) into the pixel definition layer 6, and then be reflected by the reflection layer 7, and then a part of the reflected light beams enters the escaping cone A2 to become the valid light beams for the display. Identically, the light beams transmitted in the TFT array layer 5 in the wave guide mode may be reflected by the reflection layer 7, and a part of the reflected light beams enters the escaping cone A3 to become the valid light beams for the display. As a result, it is able to improve the luminous efficiency of the OLED display element.

After the formation of the TFT array layer 5 on the base substrate 1, an additional photoetching process may be provided so as to remove a portion of the TFT array layer 5 surrounding the subpixel region. In addition, the portion of the TFT array layer 5 surrounding the subpixel region may also be removed through a last photoetching process or several last photoetching processes of the display substrate (usually for the formation of via-holes), and then the pixel definition layer 6 and the other layers thereon may be formed through the conventional processes.

In the embodiments of the present disclosure, the OEL layer of the display substrate may be formed at regions corresponding to pixels (or subpixels) through Fine Metal Mask (FMM) evaporation or printing. Due to the cost of a mainstream FMM evaporation process and the yield thereof in the prior art, it is necessary to prevent the use of an FMM-based pattern alignment evaporation process as possible.

Figure 20:
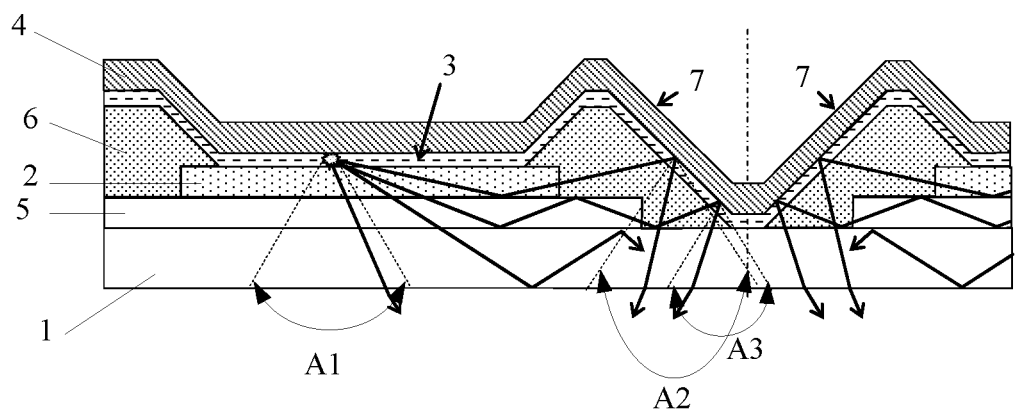
FIGS. 20-21 are schematic views showing still yet other OLED display substrates and the propagation of the light beams of the OLED display substrates according to some embodiments of the present disclosure.
Figure 21:
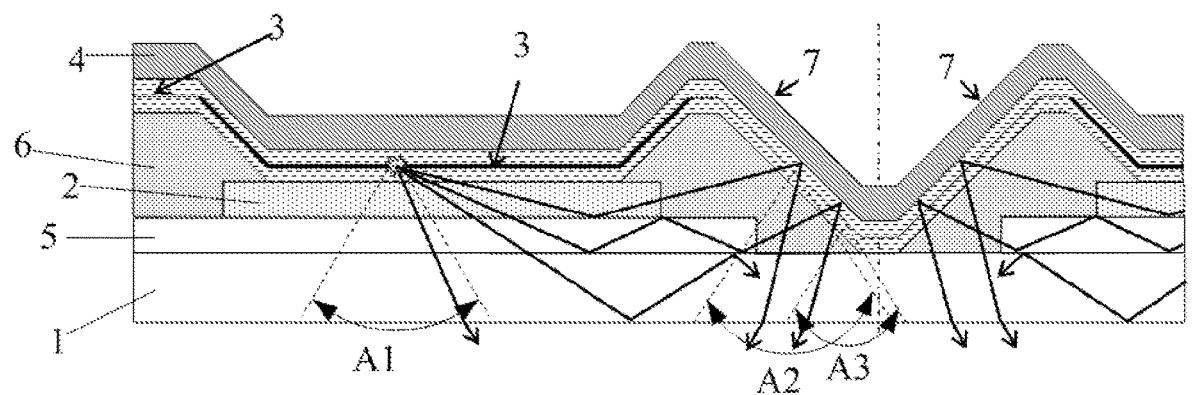

In addition, as shown in FIGS. 20 and 21, merely a part of the OEL layer may be formed with local patterns in the pixels (or subpixels) alignment process, and the other part of the OEL layer may be formed as a whole of the display region by evaporation. An electron injection layer, a hole injection layer, an electron transfer layer and a hole transfer layer may be formed through a single evaporation process, but the portions of the OEL layer corresponding to the subpixels in different colors may be formed through an FMM-based pattern alignment evaporation process with the subpixels being aligned. As shown in FIG. 21, the current flows through merely the pixel opening region defined by the pixel definition layer 6 (i.e., the region indicated by a black line in the organic light-emitting layer 3), and merely such pixel opening region emits light.

In the above two cases, the OEL layer may be deposited on the side wall of the groove in the pixel definition layer 6 or in the pixel definition layer 6 and the TFT array layer 5 before the deposition of the reflection layer 7. Strictly speaking, the reflection interface on the side wall is an interface between the OEL layer 3 and the reflection layer 7, rather than an interface between the reflection layer 7 and the pixel definition layer 6 or the TFT array layer 5. The OEL layer 3 is transparent and has a refractive index substantially similar to the pixel definition layer 6, no difference in the optical properties may occur in the embodiments of the present disclosure, which will not be particularly defined herein.

For the OLED device in an inverted BE mode, i.e., the transparent cathode, the OEL layer (or the OEL layers) and the reflective anode are formed sequentially on the base substrate. Currently, a process for manufacturing the OLED device in the inverted BE mode is not mature, and a major problem lies in that the OEL layer may be damaged when the cathode (usually made of indium tin oxide (ITO)) is formed through sputtering, so this process has not been applied in mass production. When the process becomes mature in future, for the OELD display device in the inverted BE mode, the OEL layer and the reflective anode may be formed through a single photoetching process.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to"

may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are merely preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. An organic light-emitting diode (OLED) display substrate, comprising:
   a thin film transistor (TFT) array layer, a first electrode, a pixel definition layer, an organic electroluminescence (OEL) layer and a second electrode that are arranged on a base substrate,
   wherein the pixel definition layer is configured to define a plurality of subpixel regions;
   a reflection structure is arranged to surround at least a part of the subpixel regions, and is capable of reflecting light beams that are transmitted from the OEL layer;
   a groove surrounds at least a part of the subpixel regions, and the reflection structure is a reflection layer at a side wall of the groove;
   the TFT array layer and the pixel definition layer surround at least a part of the subpixel regions, the pixel definition layer is arranged on the TFT array layer; and
   the groove is on a laminated structure consisting of the base substrate, the TFT array layer and the pixel definition layer surrounding at least a part of the subpixel regions, and a depth of the groove is greater than a sum of a thickness of the TFT array layer and a thickness of the pixel definition layer, and smaller than a sum of the thickness of the pixel definition layer, the thickness of the TFT array layer and a thickness of the base substrate, and the groove penetrates through the TFT array layer and the pixel definition layer, and penetrates into a part of the base substrate.

2. The OLED display substrate according to claim 1, wherein
   the first electrode is a transparent electrode, the second electrode is a reflective metal electrode, and the reflection layer is made of a same material as the second electrode.

3. The OLED display substrate according to claim 1, wherein
   the TFT array layer is provided with an opening surrounding at least a part of the subpixel regions, and a portion of the pixel definition layer is arranged in the opening.

4. The OLED display substrate according to claim 1, wherein
   the reflection layer comprises a first portion and a second portion, the first portion is not parallel to the TFT array layer, and the second portion is parallel to the TFT array layer.

5. The OLED display substrate according to claim 1, wherein
   the reflection layer is of a V-shaped or trapezoidal cross section, and the V-shaped or trapezoidal cross section is perpendicular to an extension direction of the groove.

6. A display device, comprising an OLED display substrate, a printed circuit, and a back plate,
   wherein the OLED display substrate comprises
   a TFT array layer, a first electrode, a pixel definition layer, an OEL layer and a second electrode that are arranged on a base substrate,
   wherein the pixel definition layer is configured to define a plurality of subpixel regions;
   a reflection structure is arranged to surround at least a part of the subpixel regions, and is capable of reflecting light beams that are transmitted from the OEL layer;
   a groove surrounds at least a part of the subpixel regions, and the reflection structure is a reflection layer at a side wall of the groove;
   the TFT array layer and the pixel definition layer surround at least a part of the subpixel regions, the pixel definition layer is arranged on the TFT array layer; and
   the groove is on a laminated structure consisting of the base substrate, the TFT array layer and the pixel definition layer surrounding at least a part of the subpixel regions, and a depth of the groove is greater than a sum of a thickness of the TFT array layer and a thickness of the pixel definition layer, and smaller than a sum of the thickness of the pixel definition layer, the thickness of the TFT array layer and a thickness of the base substrate, and the groove penetrates through the TFT array layer and the pixel definition layer, and penetrates into a part of the base substrate.

7. A method for manufacturing an OLED display substrate, comprising:
   forming a TFT array layer, a first electrode, a pixel definition layer, an OEL layer and a second electrode sequentially on a base substrate, wherein the pixel definition layer is configured to define a plurality of subpixel regions; and
   forming a reflection structure surrounding at least a part of the subpixel regions, wherein the reflection structure is capable of reflecting light beams that are transmitted from the OEL layer,
   wherein the forming the reflection structure comprises:
   forming a groove surrounding at least a part of the subpixel regions, and forming a reflection layer on a side wall of the groove,
   wherein the TFT array layer and the pixel definition layer surround at least a part of the subpixel regions, the pixel definition layer is arranged on the TFT array layer; and
   the groove is on a laminated structure consisting of the base substrate, the TFT array layer and the pixel definition layer surrounding at least a part of the subpixel regions, and a depth of the groove is greater than a sum of a thickness of the TFT array layer and a thickness of the pixel definition layer, and smaller than a sum of the thickness of the pixel definition layer, the thickness of the TFT array layer and a thickness of the base substrate, and the groove penetrates through the TFT array layer and the pixel definition layer, and penetrates into a part of the base substrate.

8. The method according to claim 7, wherein the forming the TFT array layer comprises:
   forming the TFT array layer that has an opening surrounding at least a part of the subpixel regions.

9. The method according to claim 7, wherein the forming the reflection layer comprises:

forming the second electrode and the reflection layer through a single process.

10. The method according to claim 7, wherein the forming the reflection layer comprises:
forming a first portion of the reflection layer and a second portion of the reflection layer, wherein the first portion is not parallel to the TFT array layer, and the second portion is parallel to the TFT array layer.

11. The display device according to claim 6, wherein the first electrode is a transparent electrode, the second electrode is a reflective metal electrode, and the reflection layer is made of a same material as the second electrode.

12. The display device according to claim 6, wherein the TFT array layer is provided with an opening surrounding at least a part of the subpixel regions, and a portion of the pixel definition layer is arranged in the opening.

13. The display device according to claim 6, wherein the reflection layer comprises a first portion and a second portion, the first portion is not parallel to the TFT array layer, and the second portion is parallel to the TFT array layer.

14. The display device according to claim 6, wherein the reflection layer is of a V-shaped or trapezoidal cross section, and the V-shaped or trapezoidal cross section is perpendicular to an extension direction of the groove.

* * * * *